US007005386B1

(12) United States Patent
Bell et al.

(10) Patent No.: US 7,005,386 B1
(45) Date of Patent: Feb. 28, 2006

(54) METHOD FOR REDUCING RESIST HEIGHT EROSION IN A GATE ETCH PROCESS

(75) Inventors: Scott Bell, San Jose, CA (US); Srikanteswara Dakshina-Murthy, Wappiners Falls, NY (US); Chih-Yuh Yang, San Jose, CA (US); Ashok M. Khathuria, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 188 days.

(21) Appl. No.: 10/656,467

(22) Filed: Sep. 5, 2003

(51) Int. Cl.
*H01L 21/302* (2006.01)

(52) U.S. Cl. ...................... 438/709; 438/714; 438/724; 438/725

(58) Field of Classification Search ................ 438/709, 438/710, 714, 724, 725
See application file for complete search history.

(56) References Cited

U.S. PATENT DOCUMENTS 5,965,461 A 10/1999 Yang et al.
6,107,172 A 8/2000 Yang et al.
2004/0043623 A1 * 3/2004 Liu et al. .................... 438/736
2004/0058517 A1 * 3/2004 Nallan et al. ............... 438/585
2004/0079727 A1 * 4/2004 Taylor et al. ................ 216/67

OTHER PUBLICATIONS

U.S. Appl. No. 09/822,993, filed Mar. 30, 2001, Bell et al.

* cited by examiner

*Primary Examiner*—Nadine G. Norton
*Assistant Examiner*—Binh X. Tran
(74) *Attorney, Agent, or Firm*—Farjami & Farjami LLP

(57) ABSTRACT

According to one exemplary embodiment, a method for reducing resist height erosion in a gate etch process comprises a step of forming a first resist mask on an anti-reflective coating layer situated over a substrate, where the first resist mask has a first width. The anti-reflective coating layer may be, for example, an organic material. The method further comprises a step of trimming the first resist mask to form a second resist mask, where the second resist mask has a second width, and where the second width is less than the first width. The step of trimming the first resist mask may further comprise, for example, etching the anti-reflective coating layer. According to this exemplary embodiment, the method further comprises a step of performing an HBr plasma treatment on the second resist mask, wherein the HBr plasma treatment causes a vertical etch rate of the second resist mask to decrease.

11 Claims, 8 Drawing Sheets

METHOD FOR REDUCING RESIST HEIGHT EROSION IN A GATE ETCH PROCESS

TECHNICAL FIELD

The present invention is generally in the field of semiconductor fabrication. More particularly, the present invention is in the field of transistor gate fabrication.

BACKGROUND ART

In integrated circuits comprising field-effect transistors, for example, one very important process step is the formation of the gate for each of the transistors, and in particular the dimensions of the gate. In many applications, the performance characteristics, such as switching speed, are functions of the size of the transistor's gate. Thus, for example, a narrower gate tends to produce a higher performance transistor. However, lithographic techniques impose limitations on the width of a resist mask that can be utilized to achieve a desirably narrow gate in a gate etch process.

In an effort to achieve a narrower resist mask than can be attained by lithographic techniques, a resist trim process is generally utilized in the gate etch process. During the resist trim process, the resist material is etched both laterally and vertically to reduce the height and width of the resist mask. After the resist trim process is completed, the rest of the gate stack, which typically includes an anti-reflective coating ("ARC") layer, a hard mask layer, or a combination ARC layer/hard mask layer over a gate electrode layer, must be etched. When the gate stack includes a hard mask layer, the resist mask must have a sufficient height after the resist trim process to etch the hard mask layer. When the gate stack does not include a hard mask layer, the resist mask must have a sufficient height after the trim process to etch the ARC and gate electrode layers. Thus, a first limit of the resist trim process is determined by the minimum resist height required to overcome erosion during subsequent gate etch steps. A second limit of the resist trim process is determined by the aspect ratio, i.e. height divided by width, of the resist mask during the resist trim process. For example, if the aspect ratio of the resist mask exceeds a certain critical value, the resist mask will collapse or bend, causing failure of the patterning process. As a result, it is difficult to form a resist mask that has a sufficiently narrow width while having a sufficient height to overcome erosion during subsequent gate etch steps.

One attempt to achieve a narrow transistor gate utilizes a silicon oxynitride anti-reflective film in combination with a trim etch process and is disclosed in U.S. Pat. No. 6,107,172, issued on Aug. 22, 2000, titled "Controlled Linewidth Reduction During Gate Pattern Formation Using A SiON BARC." Another attempt utilizes an organic spin-on bottom anti-reflective coating in combination with a trim etch process to achieve a narrow transistor gate. This attempt is disclosed in U.S. Pat. No. 5,965,461, issued on Oct. 12, 1999, titled "Controlled Linewidth Reduction During Gate Pattern Formation Using A Spin-On BARC."

Thus, there is a need in the art for a reliable resist mask having a desirably narrow width and sufficient height such that the resist mask can withstand height erosion during subsequent gate etch steps.

SUMMARY

The present invention is directed to method for reducing resist height erosion in a gate etch process. The present invention addresses and resolves the need in the art for a reliable resist mask having a desirably narrow width and sufficient height such that the resist mask can withstand height erosion during subsequent gate etch steps.

According to one exemplary embodiment, a method for reducing resist height erosion in a gate etch process comprises a step of forming a first resist mask on an anti-reflective coating layer situated over a substrate, where the first resist mask has a first width. The anti-reflective coating layer may be, for example, an organic material. In another embodiment, the anti-reflective coating layer may be an inorganic material. The method further comprises a step of trimming the first resist mask to form a second resist mask, where the second resist mask has a second width, and where the second width is less than the first width. The step of trimming the first resist mask may further comprise, for example, etching the anti-reflective coating layer.

According to this exemplary embodiment, the method further comprises a step of performing an HBr plasma treatment on the second resist mask, wherein the HBr plasma treatment causes a vertical etch rate of the second resist mask to decrease. For example, the HBr plasma treatment can cause the vertical etch rate of the second resist mask to decrease by between approximately 40.0 percent and approximately 80.0 percent. The method may further comprise a step of etching a hard mask layer. Other features and advantages of the present invention will become more readily apparent to those of ordinary skill in the art after reviewing the following detailed description and accompanying drawings.

DETAILED DESCRIPTION OF THE INVENTION

The present invention is directed to method for reducing resist height erosion in a gate etch process. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
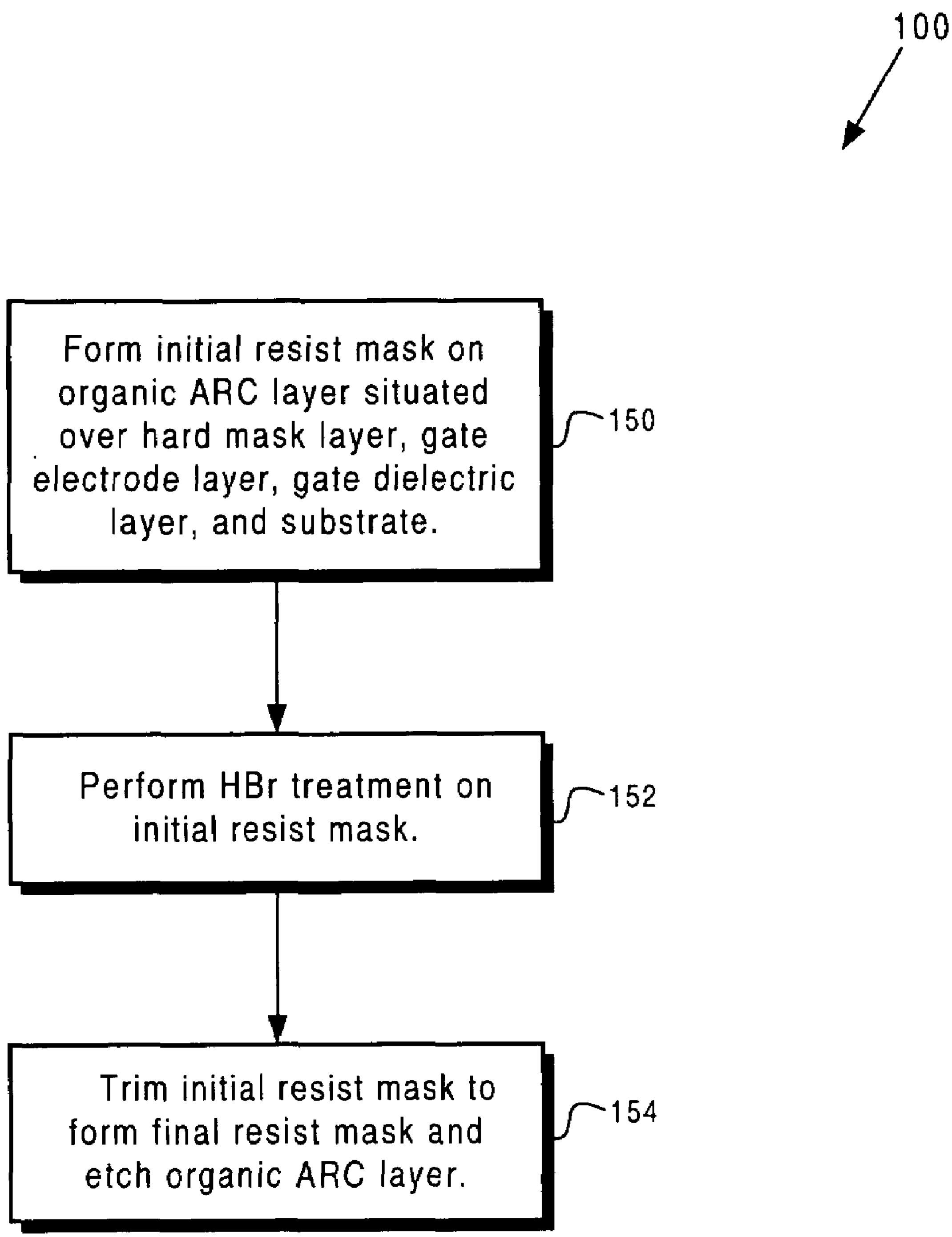
FIG. 1 is a flowchart corresponding to exemplary method steps according to one embodiment of the present invention.

FIG. 1 shows a flowchart illustrating an exemplary method for forming a resist mask in a gate etch process according to an embodiment of the present invention. The gate etch process can be, for example, a logic gate etch process, such as an NMOS or PMOS gate etch process. Certain details and features have been left out of flowchart 100 that are apparent to a person of ordinary skill in the art. For example, a step may consist of one or more substeps or may involve specialized equipment or materials, as known in the art. Steps 150, 152, and 154 indicated in flowchart 100 are sufficient to describe one embodiment of the present invention, other embodiments of the invention may utilize steps different from those shown in flowchart 100. It is noted that the processing steps shown in flowchart 100 are performed on a wafer, which, prior to step 150, includes a gate stack comprising an organic ARC layer, a hard mask layer, a gate electrode layer, and a gate dielectric layer situated over a substrate. It is noted that the hard mask layer is not utilized in an embodiment of the present invention that utilizes an inorganic ARC layer. Moreover, structures 250, 252, and 254 in FIGS. 2A, 2B, and 2C illustrate the result of performing, on a structure, such as a semiconductor die, including a substrate and the gate stack discussed above, steps 150, 152, and 154 of flowchart 100, respectively.

Figure 2A:
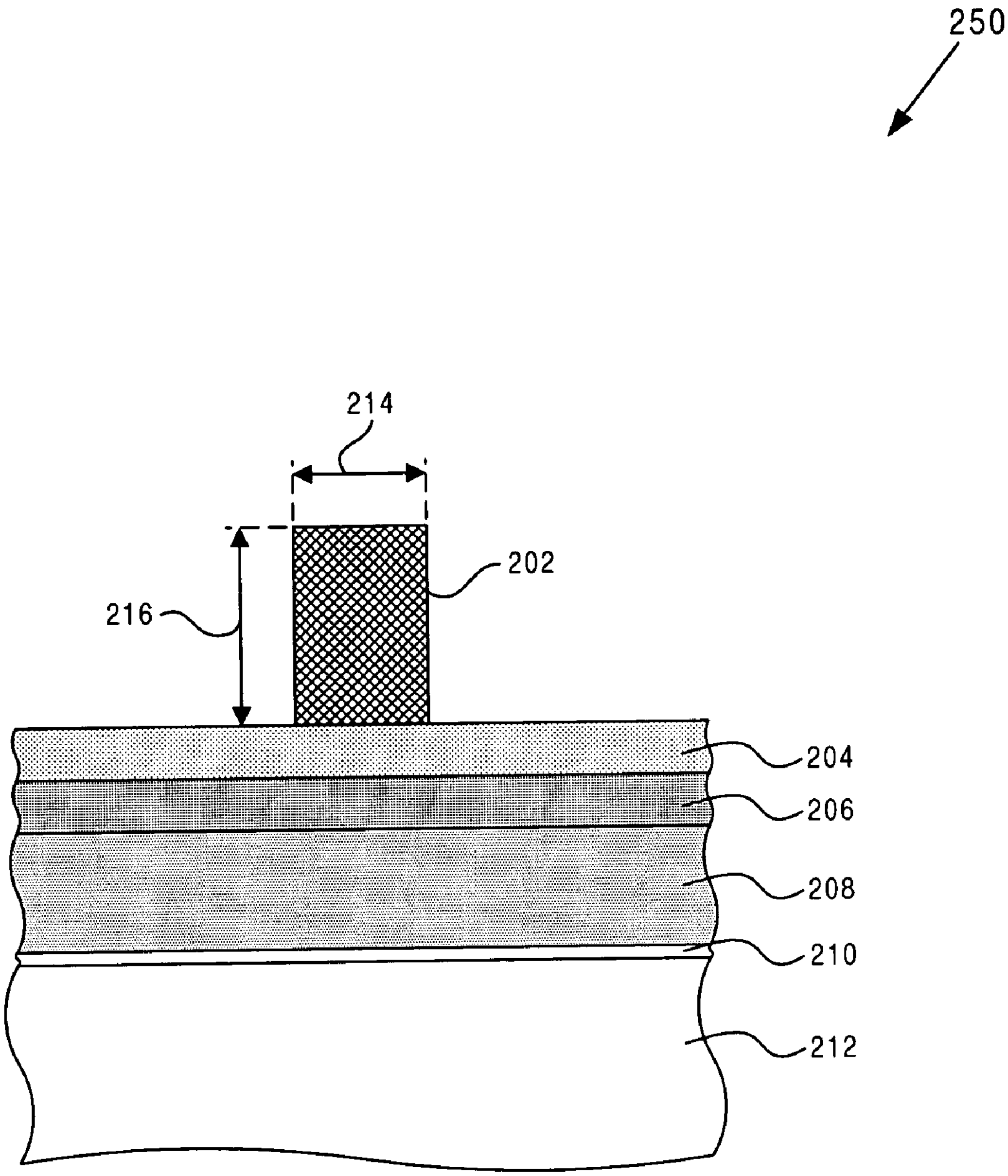
FIG. 2A illustrates a cross-sectional view of a portion of a wafer processed according to an embodiment of the invention, corresponding to certain steps of the flowchart in FIG. 1.

Referring now to step 150 in FIG. 1 and structure 250 in FIG. 2A, at step 150 of flowchart 100, initial resist mask 202 is formed on organic ARC layer 204, which is situated over hard mask layer 206, gate electrode layer 208, gate dielectric layer 210, and substrate 212. Initial resist mask 202 can be formed by depositing, patterning, and etching a layer of resist, such as a layer of photoresist or other appropriate resist material, in a manner known in the art. Initial resist mask 202 has width 214 and height 216. By way of example, width 214 can be between 90.0 nanometers ("nm") and 150.0 nm and height 216 can be between 1500.0 Angstroms and 3500.0 Angstroms. Organic ARC layer 204 can comprise AR19 or AR40, which are manufactured by Shipley Co. LLC, or other appropriate organic material and can have a thickness of between 300.0 Angstroms and 1000.0 Angstroms. In an embodiment of the present invention utilizing an inorganic ARC layer, the inorganic ARC layer can comprise an inorganic material, such as silicon nitride. Organic ARC layer 204 is situated over hard mask layer 206, which can comprise, for example, silicon nitride, silicon dioxide, or TEOS oxide. By way of example, hard mask layer 206 can have a thickness of between 300.0 Angstroms and 1000.0 Angstroms. In an embodiment of the present invention that utilizes an inorganic ARC layer, hard mask layer 206 is not utilized.

Hard mask layer 206 is situated over gate electrode layer 208, which can comprise polysilicon or other appropriate conductive material and can have a thickness of between 700.0 Angstroms and 2500.0 Angstroms. Gate electrode layer 208 is situated over gate dielectric layer 210, which can comprise silicon dioxide, nitrided oxide, hafnium oxide, or other appropriate high dielectric constant ("high-k") gate dielectric. By way of example, gate dielectric layer 210 can have a thickness of between 25.0 Angstroms and 75.0 Angstroms if gate dielectric layer 210 comprises high-k gate dielectric and a thickness of between 8.0 Angstroms and 50.0 Angstroms if gate dielectric layer 210 comprises a conventional gate dielectric. Gate dielectric layer 210 is situated over substrate 212, which can be a silicon substrate. Referring to FIG. 2A, the result of step 150 of flowchart 100 is illustrated by structure 250.

Figure 2B:
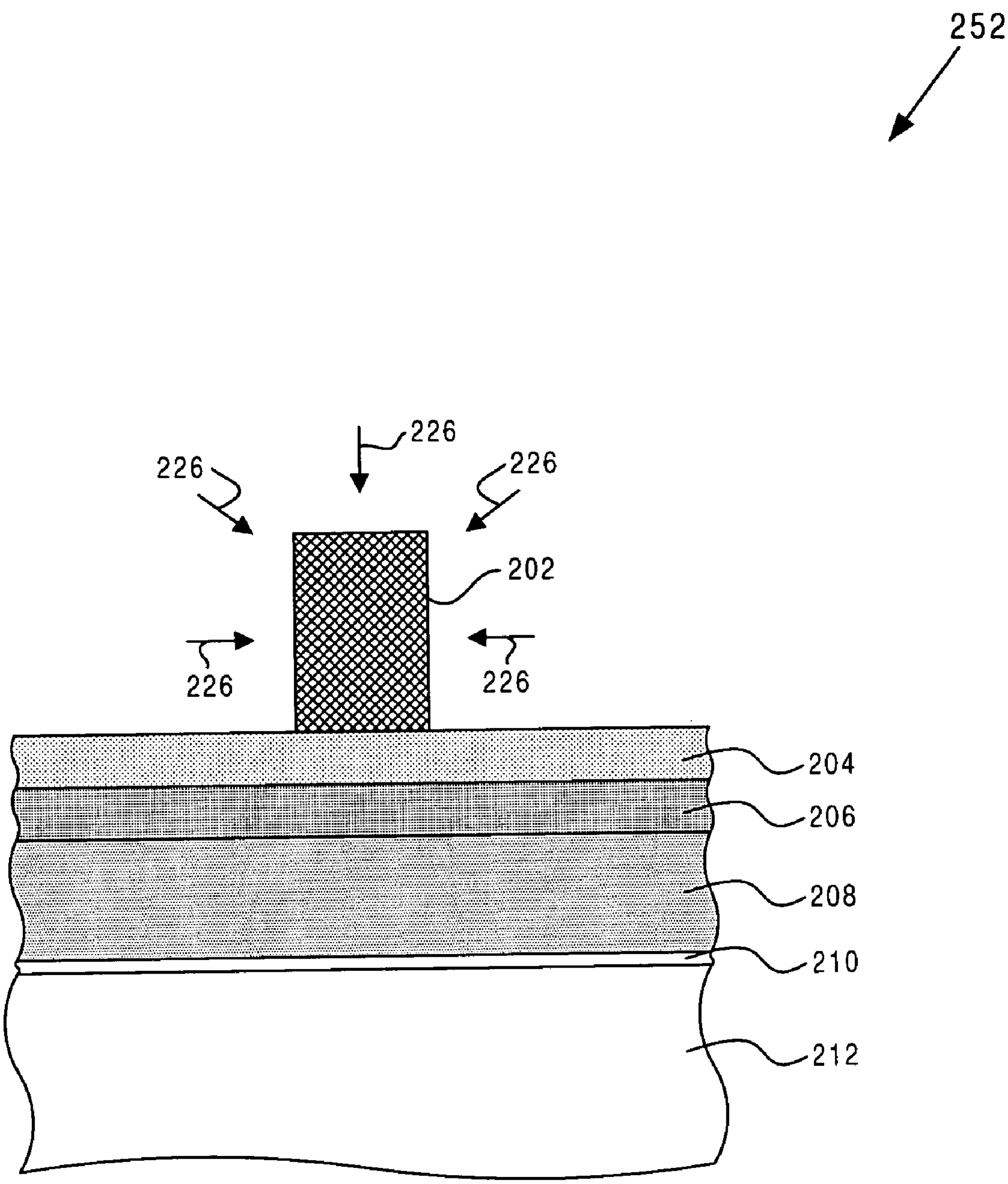
FIG. 2B illustrates a cross-sectional view of a portion of a wafer processed according to an embodiment of the invention, corresponding to certain steps of the flowchart in FIG. 1.
Figure 2C:
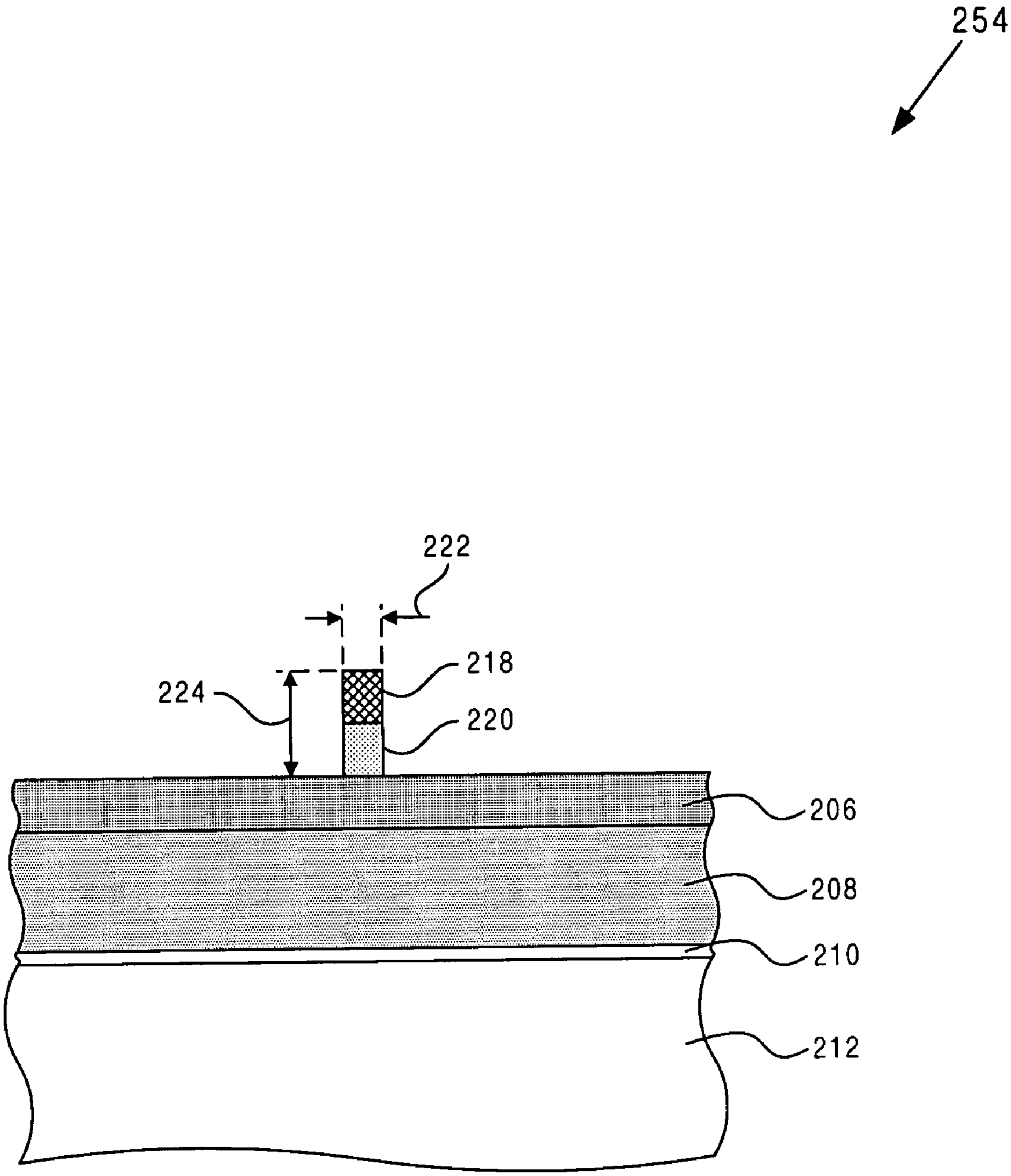
FIG. 2C illustrates a cross-sectional view of a portion of a wafer processed according to an embodiment of the invention, corresponding to certain steps of the flowchart in FIG. 1.

Continuing with step 152 in FIG. 1 and structure 252 in FIG. 2B, at step 152 of flowchart 100, hydrogen bromide ("HBr") plasma treatment 226 is performed on initial resist mask 202. HBr plasma treatment 226 can be performed in a commercially available high-density plasma source etch tool utilizing, for example, the following process parameters: a pressure of between 2.0 millitorr and 20.0 millitorr, a source power of between 800.0 watts and 1200.0 watts, a bias power of between 0.0 watts and 50.0 watts, and an HBr flow rate of between 50.0 and 200.0 standard cubic centimeters per minute ("sccm"). In the present embodiment, HBr plasma treatment 226 causes a reduction in vertical etch rate of initial resist mask 202, which results in reduced resist height erosion during a subsequent resist trim/organic ARC etch step or subsequent trim step (in an embodiment utilizing an inorganic ARC layer). Also, by utilizing an appropriate resist material to form initial resist mask 202, HBr plasma treatment 226 can cause an increase in lateral trim rate, which is desirable. As a result of HBr plasma treatment 226, the ratio of vertical to lateral etch rate during a subsequent resist trim process is decreased, which provides a wider resist trim process window. As a result, the duration of the trim process can be sufficiently increased to achieve a resist mask having a desirably narrow width. It is noted that HBr plasma treatment 226 is compatible with any type of lithographic technique. Referring to FIG. 2B, the result of step 152 of flowchart 100 is illustrated by structure 252.

Continuing with step 154 in FIG. 1 and structure 254 in FIG. 2C, at step 154 of flowchart 100, initial resist mask 202 is trimmed to form final resist mask 218 and organic ARC layer 204 is etched. A resist trim process can be utilized to trim initial resist mask 202 and etch organic ARC layer 204. In an embodiment of the present invention that utilizes an inorganic ARC layer, the inorganic ARC layer is not etched during the resist trim process. As a result of the resist trim process, final resist mask 218 is formed having width 222, which is less than width 214 of initial resist mask 202 and can be approximately equal to a desired gate channel length. By way of example, width 222 can be between 25.0 nm and 50.0 nm. During the resist trim process, organic ARC layer 204 is etched to form ARC segment 220. The combination of final resist mask 218 and ARC segment 220 has height 224, which is a sufficient height to provide a mask for etching the remainder of the gate stack. In an embodiment of the present invention utilizing an inorganic ARC layer, the final resist mask has a sufficient height to provide a mask for the remainder of the gate stack etch. Referring to FIG. 2C, the result of step 154 of flowchart 100 is illustrated by structure 254.

Thus, in the embodiment of the present invention in FIG. 1, by utilizing an HBr plasma treatment prior to a resist trim process and ARC layer etch, the present invention achieves a decreased ratio of vertical etch rate to lateral etch rate during the resist trim process. As a result, the present invention advantageously achieves an increased trim process window, which allows the present invention to provide final resist mask having a width approximately equal to a CD of a final gate channel length while requiring a reduced amount of resist material.

Figure 3:
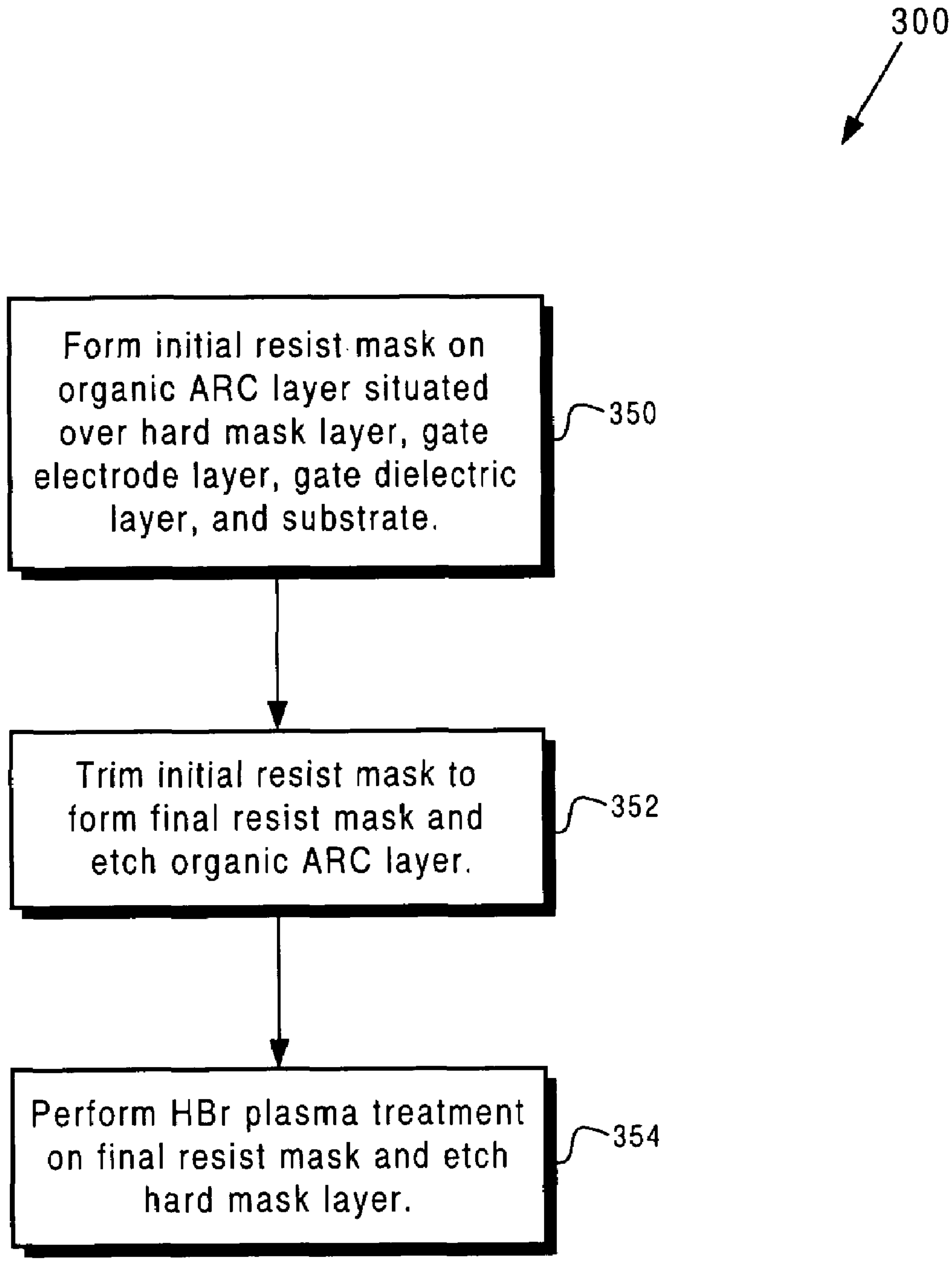
FIG. 3 is a flowchart corresponding to exemplary method steps according to one embodiment of the present invention.

FIG. 3 shows a flowchart illustrating an exemplary method for forming a resist mask in a gate etch process according to an embodiment of the present invention. Certain details and features have been left out of flowchart 300 that are apparent to a person of ordinary skill in the art. For example, a step may consist of one or more substeps or may involve specialized equipment or materials, as known in the art. Steps 350, 352, and 354 indicated in flowchart 300 are sufficient to describe one embodiment of the present invention, other embodiments of the invention may utilize steps different from those shown in flowchart 300. It is noted that the processing steps shown in flowchart 300 are performed on a wafer, which, prior to step 350, includes a gate stack comprising an organic ARC layer, a hard mask layer, a gate electrode layer, and a gate dielectric layer situated over a substrate. Moreover, structures 450, 452, and 454 in FIGS. 4A, 4B, and 4C illustrate the result of performing, on a structure, such as a semiconductor die, including a substrate and the gate stack discussed above, steps 350, 352, and 354 of flowchart 300, respectively.

Figure 4A:
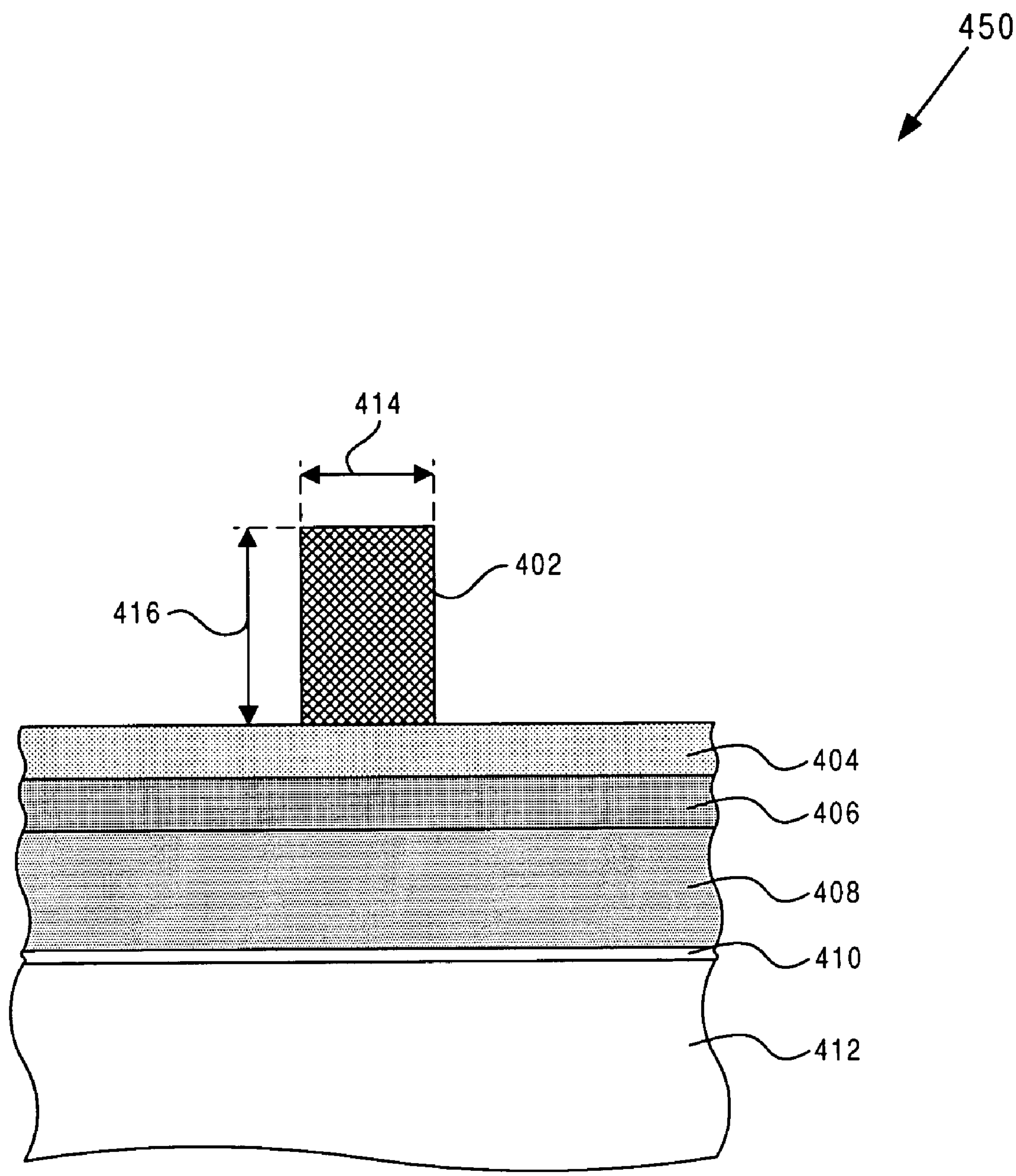
FIG. 4A illustrates a cross-sectional view of a portion of a wafer processed according to an embodiment of the invention, corresponding to certain steps of the flowchart in FIG. 3.

Referring now to step 350 in FIG. 3 and structure 450 in FIG. 4A, at step 350 of flowchart 300, initial resist mask 402 is formed on organic ARC layer 404, which is situated over hard mask layer 406, gate electrode layer 408, gate dielectric layer 410, and substrate 412. Step 350 of flowchart 300 corresponds to step 150 of flowchart 100. In particular, initial resist mask 402, organic ARC layer 404, hard mask layer 406, gate electrode layer 408, gate dielectric layer 410, substrate 412, width 414, and thickness 416 in FIG. 4A correspond, respectively, to initial resist mask 202, organic ARC layer 204, hard mask layer 206, gate electrode layer 208, gate dielectric layer 210, substrate 212, width 214, and thickness 216 in FIG. 2A. As shown in FIG. 4A, organic ARC layer 404 is situated over hard mask layer 406, hard mask layer 406 is situated over gate electrode layer 408, gate electrode layer 408 is situated over gate dielectric layer 410, and gate dielectric layer 410 is situated over substrate 412. In an embodiment utilizing an inorganic ARC layer, the gate stack does not include hard mask layer 406. Thus, at step 350, initial resist mask 402 is formed on organic ARC layer 404. Referring to FIG. 4A, the result of step 350 of flowchart 300 is illustrated by structure 450.

Figure 4B:
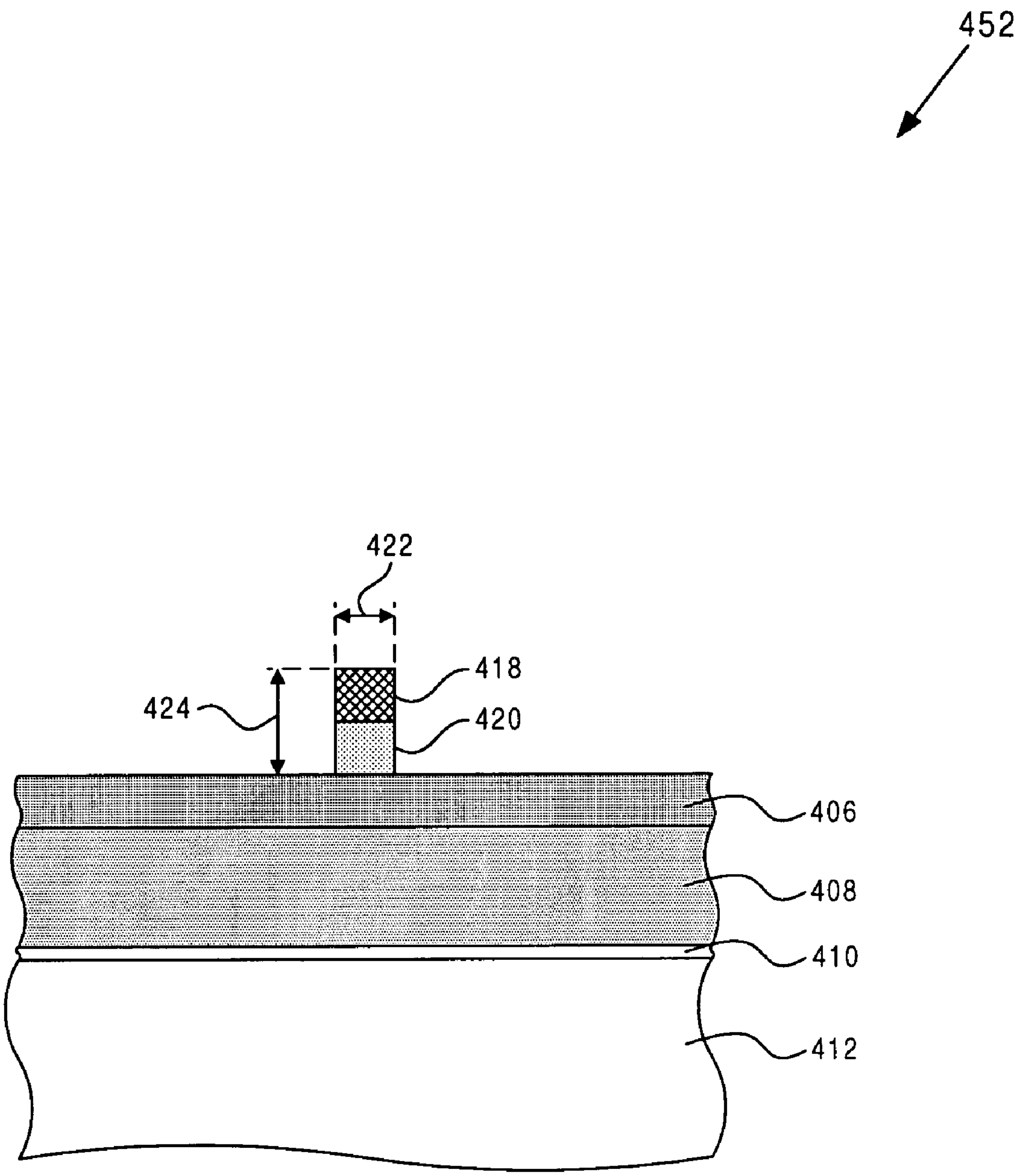
FIG. 4B illustrates a cross-sectional view of a portion of a wafer processed according to an embodiment of the invention, corresponding to certain steps of the flowchart in FIG. 3.

Continuing with step 352 in FIG. 3 and structure 452 in FIG. 4B, at step 352 of flowchart 300, initial resist mask 402 is trimmed to form final resist mask 418 and organic ARC layer 404 is etched. A resist trim process can be utilized to trim initial resist mask 402 and etch organic ARC layer 404. In an embodiment of the present invention that utilizes an inorganic ARC layer, the inorganic ARC layer is not etched during the resist trim process. In such embodiment, final resist mask 418 would be formed over the inorganic ARC layer during the resist trim process. As a result of the resist trim process, final resist mask 418 has width 422, which is less than width 414 of initial resist mask 402 and can be approximately equal to a desired gate channel length. In the present embodiment, organic ARC segment 420 is formed over hard mask layer 406 during the resist trim process. The combination of final resist mask 418 and organic ARC segment 420 has height 424, which is a sufficient height for etching the remainder of the gate stack after a subsequent HBr plasma treatment has been performed. Referring to FIG. 4B, the result of step 352 of flowchart 300 is illustrated by structure 452.

Figure 4C:
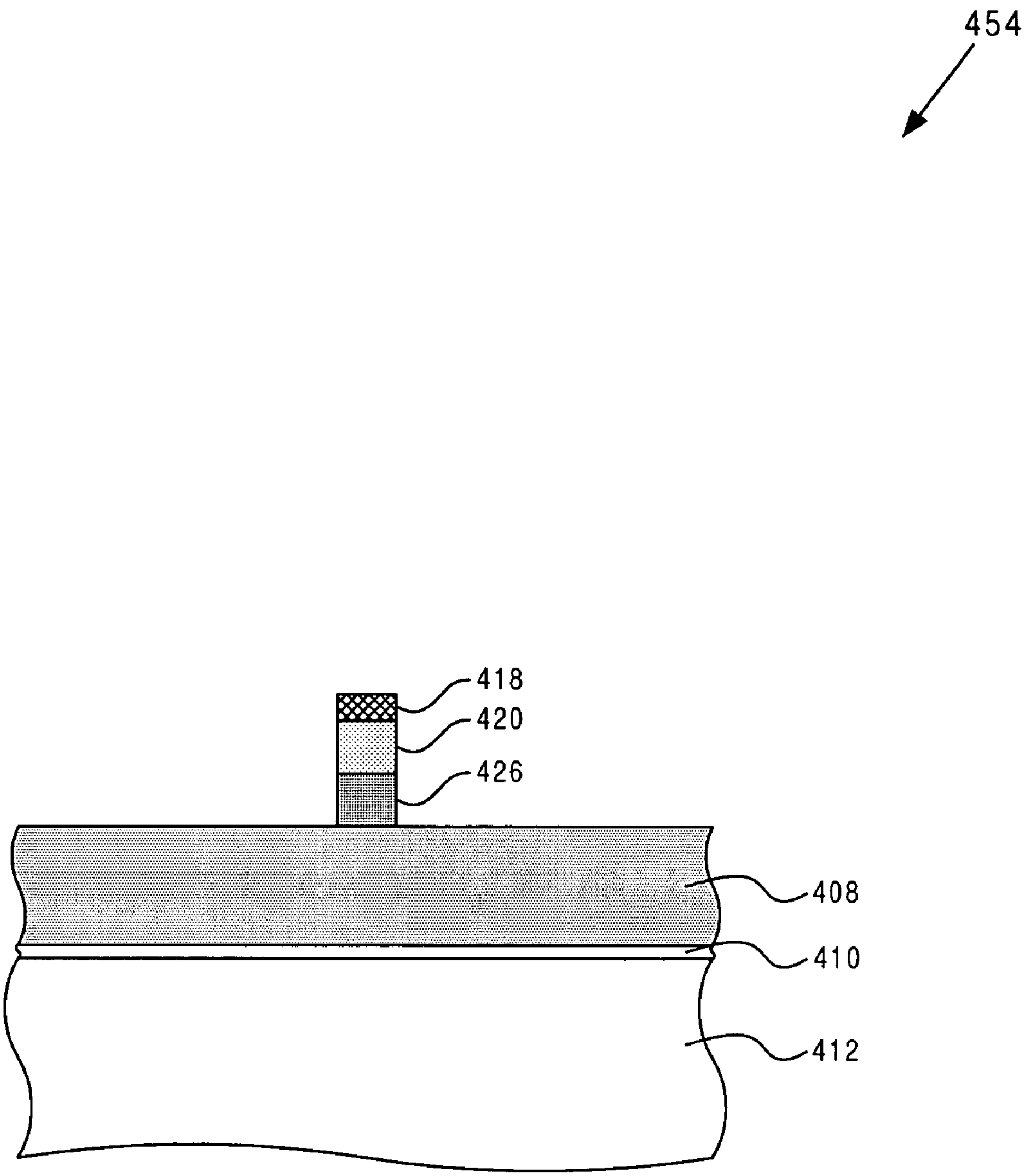
FIG. 4C illustrates a cross-sectional view of a portion of a wafer processed according to an embodiment of the invention, corresponding to certain steps of the flowchart in FIG. 3.

Continuing with step 354 in FIG. 3 and structure 454 in FIG. 4C, at step 354 of flowchart 300, an HBr plasma treatment is performed on final resist mask 418 and hard mask layer 406 is etched to form hard mask segment 426. The HBr plasma treatment can be performed in a commercially available high-density plasma source etch tool utilizing similar process parameters as discussed above in relation to the embodiment of the present invention in FIG. 1. In the present embodiment, the HBr plasma treatment causes the vertical etch rate of final resist mask 418 to be reduced during subsequent gate stack etch steps. By way of example, the HBr plasma treatment can reduce the vertical etch rate of final resist mask 418 by between approximately 40.0 percent and approximately 80.0 percent. After the HBr plasma treatment, hard mask layer 406 is etched to form hard mask segment 426 by utilizing final resist mask 418 and organic ARC segment 420 as a mask. In an embodiment utilizing an inorganic ARC layer, the final resist mask would be utilized to etch the inorganic ARC layer. Referring to FIG. 4C, the result of step 354 of flowchart 300 is illustrated by structure 454.

Thus, in the embodiment of the present invention in FIG. 3, by utilizing an HBr plasma treatment after a resist trim process and organic ARC layer etch (or after a resist trim process in an embodiment utilizing an inorganic ARC layer), the present invention reduces the vertical etch rate of the final resist mask, which reduces resist height erosion in subsequent gate etch steps. As a result, the present invention achieves a wider trim process window by reducing the height of the final resist mask required during the subsequent gate etch steps.

In other embodiments, the HBr plasma treatment of the present invention can be performed before and after a resist trim process/organic ARC layer etch or before and after a resist trim process in an embodiment utilizing an inorganic ARC layer.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, method for reducing resist height erosion in a gate etch process has been described.

The invention claimed is:

1. A method for reducing resist height erosion in a gate etch process, said method comprising steps of:

forming a first resist mask on an anti-reflective coating layer situated over a substrate, said first resist mask having a first width;

trimming said first resist mask to form a second resist mask, said second resist mask having a second width, said second width being less than said first width;

performing an HBr plasma treatment on said second resist mask;

wherein said HBr plasma treatment causes a vertical etch rate of said second resist mask to decrease; and wherein said HBr plasma treatment causes said vertical etch rate of said second resist mask to decrease by between approximately 40.0 percent and 80.0 percent.

2. The method of claim 1 wherein said step of trimming said first resist mask to form a second resist mask comprises etching said anti-reflective coating layer.

3. The method of claim 1 further comprising a step of etching said anti-reflective coating layer.

4. The method of claim 1 wherein said anti-reflective coating layer comprises an organic material.

5. The method of claim 1 wherein said anti-reflective coating layer comprises an inorganic material.

6. A method for reducing resist height erosion in a gate etch process, said method comprising steps of:

forming a first resist mask on an anti-reflective coating layer situated over a substrate, said first resist mask having a first width;

performing an HBr plasma treatment on said first resist mask;

trimming said first resist mask to form a second resist mask, said second resist mask having a second width, said second width being less than said first width;

wherein said HBr plasma treatment causes a vertical etch rate of said first resist mask to decrease; wherein said HBr plasma treatment causes an increase in a lateral etch rate of said first resist mask.

7. The method of claim 6 wherein said step of trimming said first resist mask to form a second resist mask comprises etching said anti-reflective coating layer.

8. The method of claim 6 wherein said second width is between approximately 25.0 nanometers and approximately 50.0 nanometers.

9. The method of claim 6 further comprising a step of etching said anti-reflective coating layer.

10. The method of claim 6 wherein said anti-reflective coating layer comprises an organic material.

11. The method of claim 6 wherein said anti-reflective coating layer comprises an inorganic material.

* * * * *